US012765041B2

(12) United States Patent
Wang et al.

(10) Patent No.: US 12,765,041 B2
(45) Date of Patent: Oct. 13, 2026

(54) SEMICONDUCTOR PROCESSING TOOL AND METHODS OF OPERATION

(71) Applicant: Taiwan Semiconductor Manufacturing Company, Ltd., Hsinchu (TW)

(72) Inventors: Ching-Hung Wang, Tainan (TW); Tzu-Wei Yu, Tainan (TW); Pin Yen Hsieh, Tainan (TW); Yeong-Jyh Lin, Tainan (TW); Kuan-Liang Liu, Tainan (TW); Ching I Li, Tainan (TW); Kai-Yun Yang, Tainan (TW); Min-Chang Ching, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 429 days.

(21) Appl. No.: 18/424,016

(22) Filed: Jan. 26, 2024

(65) Prior Publication Data

US 2025/0248105 A1 Jul. 31, 2025

(51) Int. Cl.

| | |
|---|---|
| ***H10D 84/03*** | (2025.01) |
| ***H10D 88/00*** | (2025.01) |
| ***H10P 72/00*** | (2026.01) |
| ***H10P 72/72*** | (2026.01) |
| ***H10P 72/78*** | (2026.01) |
| ***H10P 74/20*** | (2026.01) |

(52) U.S. Cl.

CPC ........... *H10D 84/038* (2025.01); *H10D 88/01* (2025.01); *H10P 72/0428* (2026.01); *H10P 72/0604* (2026.01); *H10P 72/722* (2026.01); *H10P 72/78* (2026.01); *H10P 74/203* (2026.01)

(58) Field of Classification Search

CPC ........................................................ H10P 72/78

See application file for complete search history.

(56) References Cited

U.S. PATENT DOCUMENTS

| | | | | |
|---|---|---|---|---|
| 12,463,081 B2 * | 11/2025 | Choi | ........................ | H10P 72/78 |
| 2009/0186560 A1 * | 7/2009 | Kordic | .................... | B24B 37/30 451/36 |
| 2023/0378125 A1 | 11/2023 | Yu et al. | | |

FOREIGN PATENT DOCUMENTS

| | | |
|---|---|---|
| CN | 207367937 U | 5/2018 |
| TW | 202347536 A | 12/2023 |

* cited by examiner

*Primary Examiner* — Benjamin P Sandvik

(74) *Attorney, Agent, or Firm* — Harrity & Harrity, LLP

(57) ABSTRACT

Some implementations described herein provide a bonding tool having a top bonding fixture that includes an inflatable forcing structure (e.g., a gas bag). When pressurized, the inflatable forcing structure has a curved surface that protrudes from an under side of the top bonding fixture to deform a top semiconductor substrate during a bonding operation. A rate of inflation and/or a pressure within the inflatable forcing structure may be controlled to distribute a force more evenly in a bond region of the semiconductor substrate relative to another bonding tool having another top bonding fixture including a striker pin.

20 Claims, 10 Drawing Sheets

SEMICONDUCTOR PROCESSING TOOL AND METHODS OF OPERATION

BACKGROUND

Three-dimensional integrated circuits (3DICs) are a recent development in semiconductor packaging in which multiple semiconductor dies are stacked upon one another (e.g., using package-on-package (POP), system-in-package (SiP) packaging techniques, and/or stacked die packaging techniques). 3DICs provide improved integration density and other advantages, such as faster speeds and higher bandwidth, because of decreased length of interconnects between the stacked dies. Some methods of forming 3DICs involve bonding together two semiconductor wafers. For example, the wafers may be bonded together using fusion bonding, eutectic bonding, and/or hybrid bonding, among other examples.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
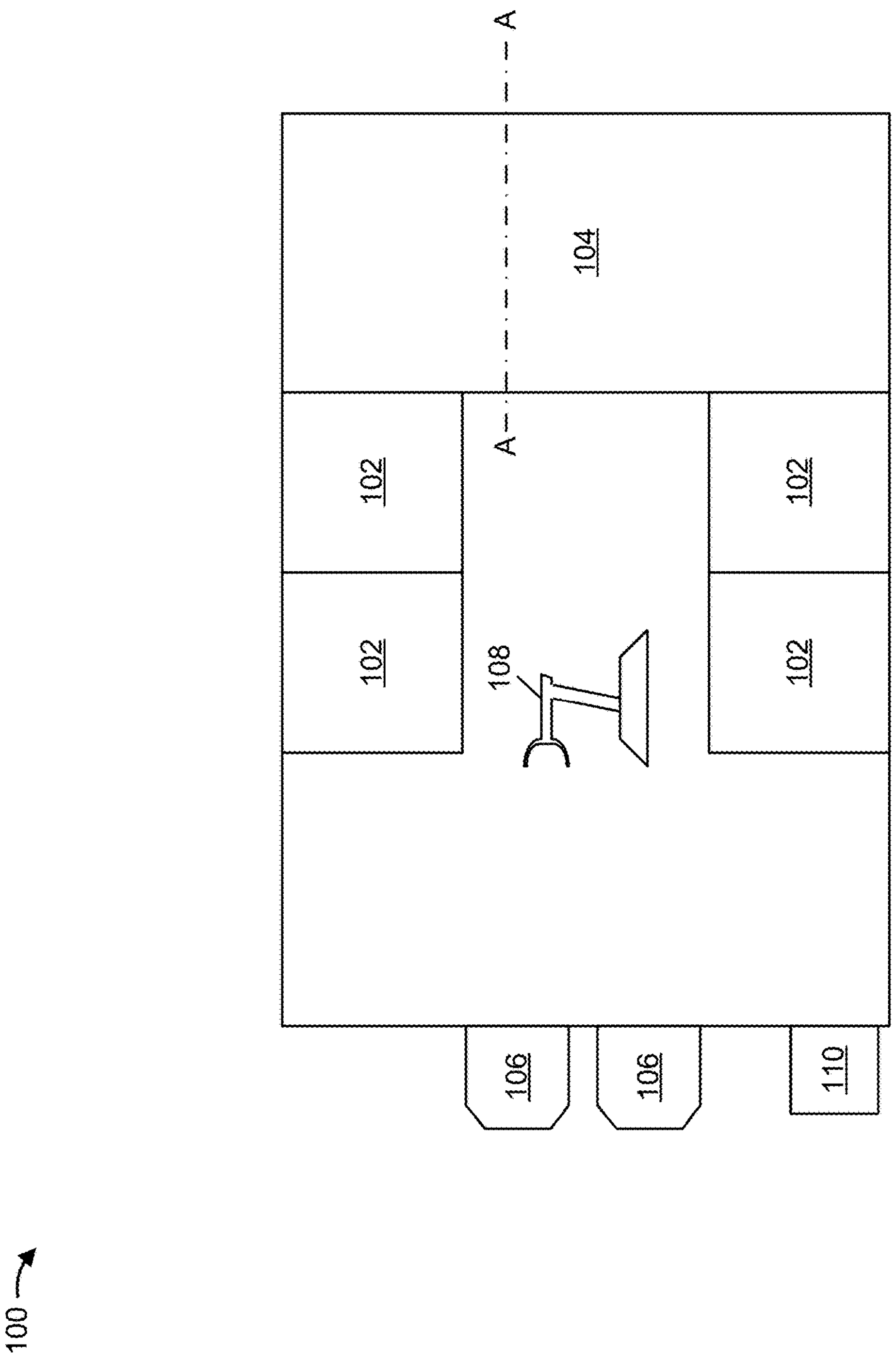
FIG. 1 is a diagram of an example bonding tool described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A bonding tool includes opposing bonding fixtures (e.g., a top bonding fixture and a bottom bonding fixture) that hold two semiconductor substrates (e.g., a top semiconductor substrate and a bottom semiconductor substrate) during a bonding operation that joins the two semiconductor substrates together. In some cases, and when bonding the two semiconductor substrates, the top semiconductor substrate may be deformed by a mechanism such as a striker pin, while a bottom semiconductor substrate may be deformed by an inflatable bag (e.g., an air bag or a liquid bag) or air pressure in a bonding tool. The deformed semiconductor substrates are then pressed together near the center of the deformed semiconductor substrates. The attraction of the deformed semiconductor substrates propagates outward from the center to the edge of the deformed semiconductor substrate. This outward propagation is referred to as bonding wave propagation.

Overlay performance (e.g., the alignment of the top and bottom semiconductor substrates) is a performance parameter that can heavily influence the yield of semiconductor devices from the top semiconductor substrate and the bottom semiconductor substrate. A difference between a center of the top semiconductor substrate and a center of the bottom semiconductor substrate after bonding (and/or between an edge of the top semiconductor substrate and an edge of the bottom semiconductor substrate after bonding) is referred to as misalignment, scale, or run out. Even small amounts of misalignment can result in significant reductions in semiconductor device yield, particularly as semiconductor device density increases. In some cases, use of the striker pin to deform the top semiconductor substrate may abruptly deform the top semiconductor substrate to generate a bonding wave that causes the misalignment to reduce the semiconductor device yield.

Some implementations described herein provide a bonding tool having a top bonding fixture that includes an inflatable forcing structure (e.g., an enclosed gas bag). When pressurized, the inflatable forcing structure has a curved surface that protrudes from an under side of the top bonding fixture to deform a top semiconductor substrate during a bonding operation. A rate of inflation and/or a pressure within the inflatable forcing structure may be controlled to distribute a force more evenly in a bond region of the semiconductor substrate relative to another bonding tool having another top bonding fixture including a striker pin.

In this way, the bonding tool may generate a more controlled bonding wave to improve an overlay performance. Improving the overlay performance may improve a yield of a product (e.g., a yield of a 3DIC device such as a CSI BSI device) to reduce an amount of resources (e.g., semiconductor processing tools, raw materials, manpower, and/or computing resources) needed to manufacture a volume of the product.

FIG. 1 is a diagram of an example bonding tool 100 described herein. The bonding tool 100 may include an example of a hybrid bonding tool, a eutectic bonding tool, a direct bonding tool, a fusion bonding tool, and/or another type of bonding tool that is configured to bond two or more semiconductor substrates together. FIG. 1 illustrates a side view of the bonding tool 100.

As shown in FIG. 1, the bonding tool 100 may include various components, such as one or more processing chambers 102, one or more processing chambers 104, one or more load ports 106, a transport tool 108, and a controller 110, among other components.

The load port(s) 106 may be configured to receive and support front opening unified pods (FOUPs) and/or another type of semiconductor substrate transport carriers. The transport tool 108 may obtain semiconductor substrates from and/or provide semiconductor substrates to substrate transport carrier on a load port 106.

The transport tool 108 may include a robotic arm, a substrate carrying tool, and/or another type of tool that is configured to transfer semiconductor substrates to and from the load port(s) 106, and among the processing chambers 102 and 104. The transport tool 108 and the processing chambers 102 and 104 may be included in an environmentally controlled environment in the bonding tool 100 to reduce the likelihood of exposure of semiconductor substrates in the bonding tool 100 to humidity, particles, and/or another type of contaminants.

The processing chambers 102 may each include a processing chamber in which semiconductor substrates are prepared for bonding, inspected, and/or further processed. For example, a processing chamber 102 may be configured for pre-cleaning semiconductor substrates prior to bonding. As another example, a processing chamber 102 may be configured for depositing one or more bonding layers onto a semiconductor substrate prior to bonding. As another example, a processing chamber 102 may be configured to measure a semiconductor substrate to facilitate alignment of the semiconductor substrate with another semiconductor substrate in the processing chamber 104.

The processing chamber 104 may include a processing chamber of the bonding tool 100. Semiconductor substrates may be bonded together in the processing chamber 104 using a hybrid bonding technique, a eutectic bonding technique, a direct bonding technique, a fusion bonding technique, and/or another bonding technique.

As shown in FIG. 1, the processing chamber 104 includes a reference section line A-A. As described in greater detail in connection with FIGS. 2A, 2B, and elsewhere herein with reference to the section line A-A, the processing chamber 104 may include a combination of bonding fixtures to support the semiconductor substrates during bonding.

The bonding tool 100 includes a controller 110. The controller 110 may correspond to a processor, a workstation, a desktop computer, an integrated computing system, and/or another type of computing device. The controller 110 is configured to communicate with and/or control actions of various components and/or subsystems of the bonding tool 100, including the processing chambers 102, the processing chamber 104, the load port(s) 106, and/or the transport tool 108, among other examples. In some implementations, the controller 110 transmits signals to the bonding tool 100 and/or the components thereof to cause the bonding tool 100 and/or the components thereof to perform a bonding operation to bond two or more semiconductor substrates together. In some implementations, the controller 110 transmits signals to the bonding tool 100 and/or the components thereof to cause the bonding tool 100 and/or the components thereof to monitor one or more aspects of a bonding operation, such as a bonding wave propagation between two or more semiconductor substrates, as described herein.

As described in greater detail in connection with FIGS. 2A-7, the bonding tool 100 may perform a series of operations. The series of operations includes receiving a first semiconductor substrate on a first bonding fixture including a first inflatable forcing structure in a recess of a first chuck component, where the first bonding fixture includes a first vacuum port structure passing through the first inflatable forcing structure and the first chuck component. The series of operations includes activating a first vacuum supply system to draw the first semiconductor substrate to a surface of the first inflatable forcing structure. The series of operations includes receiving a second semiconductor substrate on a second bonding fixture including a second inflatable forcing structure in a recess of a second chuck component, where the second bonding fixture includes a second vacuum port structure passing through the second inflatable forcing structure and the second chuck component. The series of operations includes activating a second vacuum supply system to draw the second semiconductor substrate to a surface of the second inflatable forcing structure. The series of operations includes activating a first gas supply system to inflate the first inflatable forcing structure. The series of operations includes activating a second gas supply system to inflate the second inflatable forcing structure. The series of operations includes performing a bonding operation that joins the first semiconductor substrate with the second semiconductor substrate after inflating the first inflatable forcing structure and inflating the second inflatable forcing structure.

Additionally, or alternatively, the series of operations includes receiving a semiconductor substrate on a bonding fixture including an inflatable forcing structure in a recess of a chuck component. The series of operations includes activating a vacuum supply system to draw a vacuum through a plurality of vacuum port structures that pass through the inflatable forcing structure to draw the semiconductor substrate against a surface of the inflatable forcing structure. The series of operations includes activating a gas supply system to provide a pressurized gas through a gas inlet port structure that enters the inflatable forcing structure to inflate the inflatable forcing structure. The series of operations includes performing a bonding operation that joins the semiconductor substrate with another semiconductor substrate after inflating the inflatable forcing structure.

As indicated above, FIG. 1 is provided as an example. Other examples may differ from what is described with regard to FIG. 1.

Figure 2A:
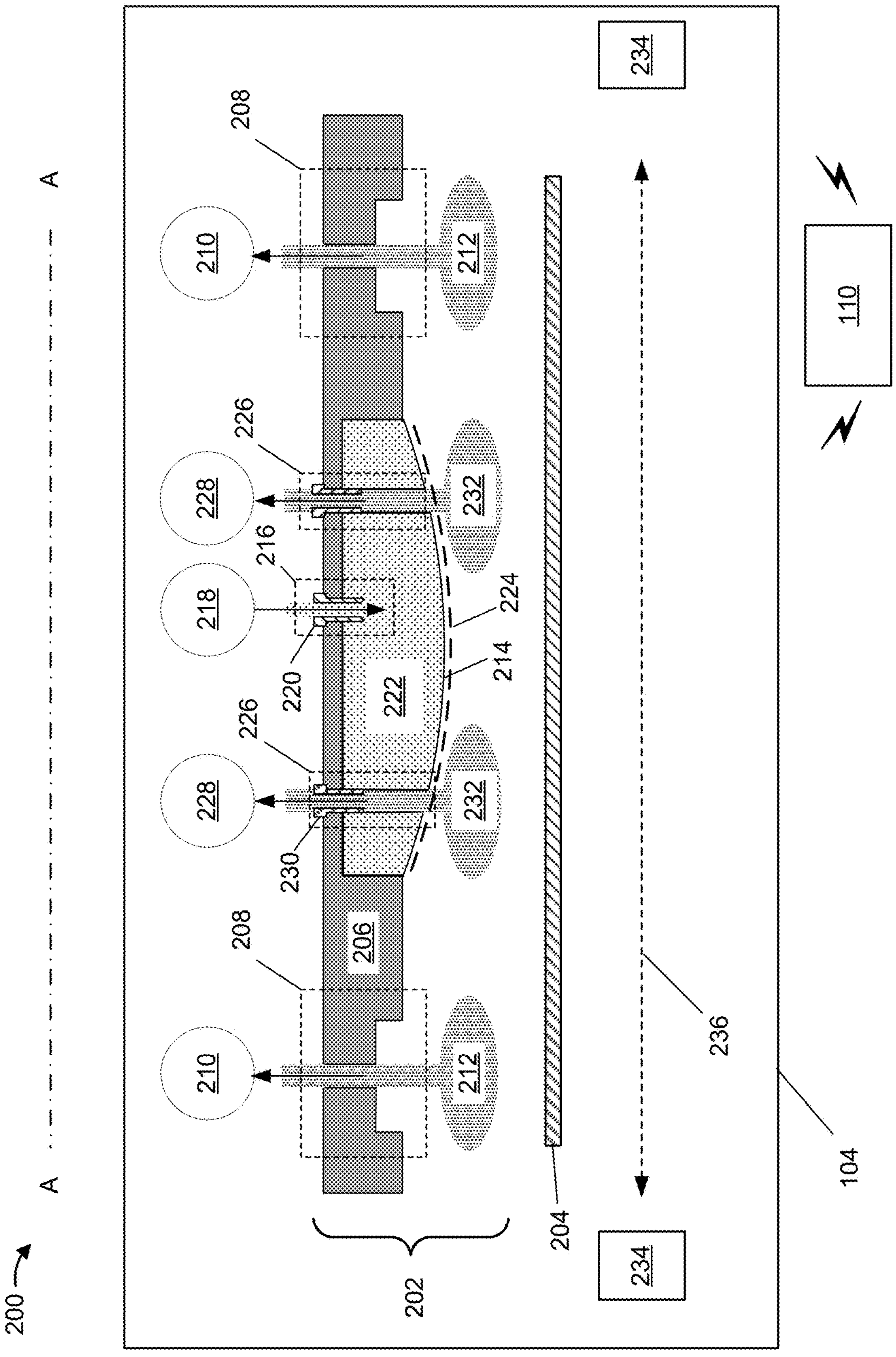
FIGS. 2A and 2B are diagrams of an example implementation of the processing chamber of the bonding tool described herein.
Figure 2B:
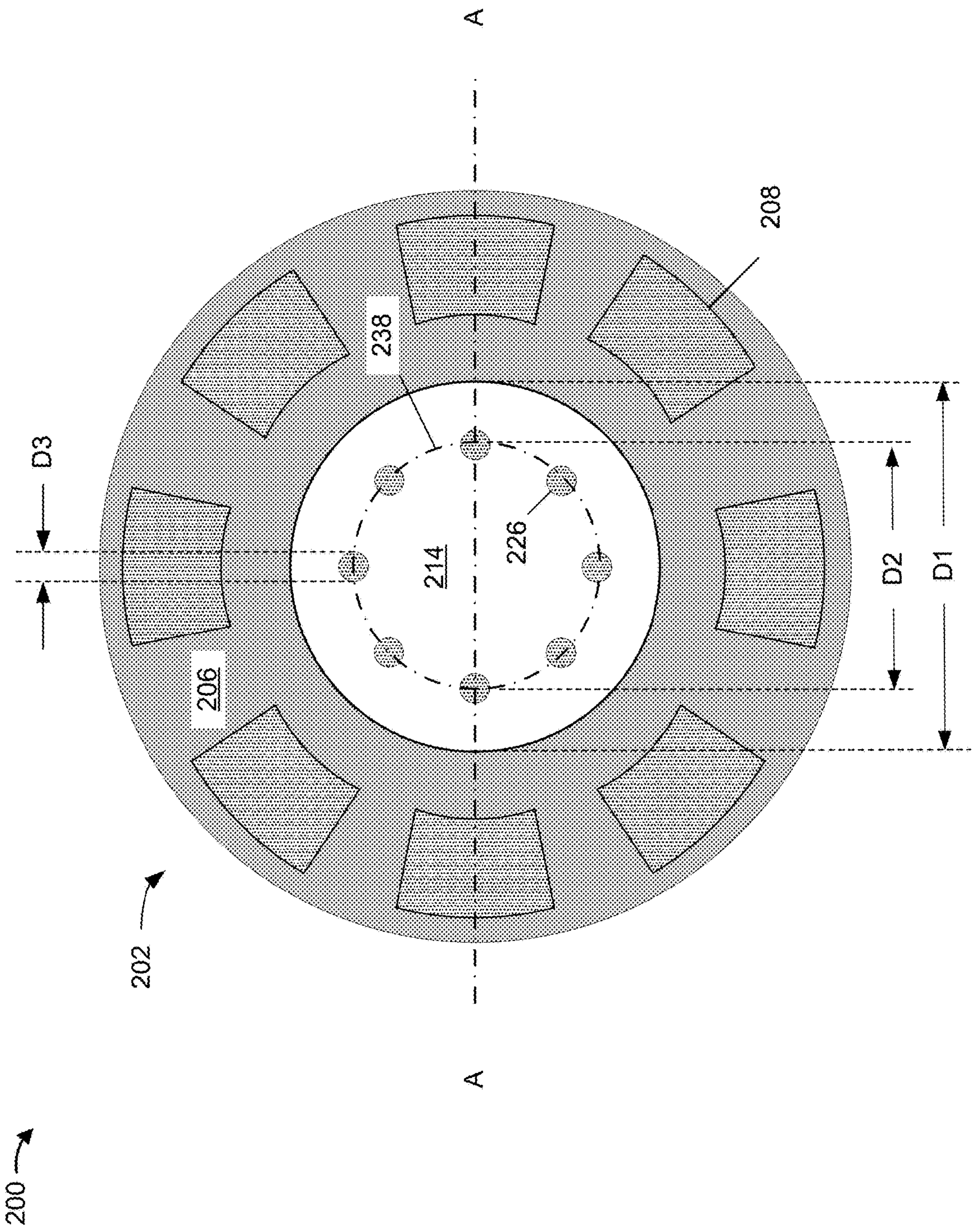

FIGS. 2A and 2B are diagrams of an example implementation 200 of the processing chamber 104 of the bonding tool 100 described herein. The processing chamber 104 may include an example of a hybrid processing chamber, a cutectic processing chamber, a direct processing chamber, and/or another type of processing chamber in which two or more semiconductor substrates may be bonded together.

FIG. 2A illustrates a cross-section view along the section line A-A of the processing chamber 104, including a bonding fixture 202. As described in greater detail in connection with FIGS. 3A-3D and elsewhere herein, the bonding fixture 202 is configured to receive, support, and deform a bond region of a semiconductor substrate 204 during a bonding operation. The semiconductor substrate 204 may include a semiconductor wafer (e.g., a silicon wafer, a silicon on insulator (SOI) wafer) or another type of substrate on which semiconductor devices may be formed and manufactured. The semiconductor substrate 204 may be bonded with another semiconductor substrate in the processing chamber 104 to form stacked semiconductor devices.

The bonding fixture 202 includes a chuck component 206. In some implementations, and as shown in FIG. 2A, the chuck component 206 corresponds to a vacuum chuck that includes at least one vacuum pad structure 208 connected to a vacuum supply system 210. The vacuum supply system 210 may provide a vacuum through the vacuum pad structure 208 to generate a vacuum force 212 that secures a perimeter region of the semiconductor substrate 204 against a surface of the chuck component 206. Alternatively, the chuck component 206 may correspond to an electro-static chuck (ESC) and/or another type of chuck.

The bonding fixture 202 further includes an inflatable forcing structure 214 in a recess of the chuck component 206. Walls of the inflatable forcing structure 214 (an enclosed gas bag, a bladder, a thin-walled vessel, or a membrane, among other examples) may include a material such a titanium nitride material or a 3 mol percentage yttria-stabilized zirconia material, among other examples. Additionally, or alternatively, walls of the inflatable forcing structure 214 may include a material having a modulus of elasticity (e.g., a Young's modulus) that is included in a range of approximately 100 gigapascal (GPa) to approximately 270 GPa, among other examples. Additionally, or alternatively, walls of the inflatable forcing structure 214 may include a material having a fracture toughness that is included in a range of approximately 1.8 megapascals per meter squared ($MPa/m^2$) to approximately 7.0 $MPa/m^2$. However, other materials, ranges, and/or values for the modulus of elasticity, and ranges and/or values for the fracture toughness are within the scope of the present disclosure.

As shown in FIG. 2A, the bonding fixture 202 further includes a gas inlet port structure 216 that passes through the chuck component 206 and into the inflatable forcing structure 214. Furthermore, the gas inlet port structure 216 connects with a gas supply system 218. In some implementations, the gas inlet port structure 216 includes a sleeve component 220 (e.g., an adapter) that passes through the chuck component 206 to connect the gas inlet port structure 216 and the gas supply system 218.

In some implementations, the gas inlet port structure 216 is configured to provide a pressurized gas 222 (e.g., pressurized nitrogen ($N_2$)) from the gas supply system 218 into the inflatable forcing structure 214. The pressurized gas 222 may inflate the inflatable forcing structure 214 to form a convex curvature 224 along an outer surface of the inflatable forcing structure 214. The convex curvature 224 may protrude outside the cavity (e.g., protrude beyond a surface of the chuck component 206) and provide a force that deforms a central region (e.g., a bond region) of the semiconductor substrate 204 during a bonding operation that joins the semiconductor substrate 204 with another semiconductor substrate.

In some implementations, a pressure of the pressurized gas 222 is included in a range of approximately 50 millibars to approximately 1000 millibars. A pressure greater than or equal to approximately 50 millibars (in combination with an area of the inflatable forcing structure 214) may provide a force that is sufficient to deform the semiconductor substrate 204 and/or begin propagation of a bonding wave. A pressure that is less than approximately 50 millibars may not provide a force that is sufficient to deform the semiconductor substrate 204 and/or begin propagation of the bonding wave. A pressure that is equal to or less than approximately 1000 millibars may provide the force that is sufficient to deform the semiconductor substrate 204 and begin propagation of the bonding wave without damaging the semiconductor substrate 204. A pressure that is greater than approximately 1000 millibars may cause an excessive force that bows the semiconductor substrate 204 to a point of damaging the semiconductor substrate 204. However, other values and ranges for the pressure of the pressurized gas 222 are within the scope of the present disclosure.

As shown in FIG. 2A, at least one vacuum port structure 226 passes through the chuck component 206 and the inflatable forcing structure 214. Furthermore, a vacuum supply system 228 (e.g., a vacuum pump) connects to the vacuum port structure 226. The vacuum port structure 226 may further includes a sleeve component 230 (e.g., an adapter) that passes through the chuck component 206 to connect the vacuum port structure 226 with the vacuum supply system 228.

The vacuum port structure 226 may include a tube, a liner, or another type of scaled passageway through which the vacuum supply system 228 draws vacuum to generate a vacuum force 232 near an outer surface of the inflatable forcing structure 214. In some implementations, the vacuum port structure 226 includes a material having a degree of elasticity that enables the vacuum port structure 226 to expand and/or contract in a vertical direction. In some implementations, the vacuum port structure 226 includes structures such as folds, ribs, and/or pleats that enable the vacuum port structure 226 to expand and/or contract in the vertical direction.

In some implementations, the vacuum force 232 secures a surface of the semiconductor substrate 204 against the inflatable forcing structure 214 during deformation of the semiconductor substrate. Securing the surface of the semiconductor substrate 204 against the inflatable forcing structure 214 may reduce a shift and/or a slipping of a location of the semiconductor substrate 204 to reduce misalignment during the bonding operation and improve an overlay performance of a bonding tool using the bonding fixture 202 (e.g., improve a bonding performance of the bonding tool 100.)

As further shown in FIG. 2A, a sensor system 234 may be included in the processing chamber 104. The sensor system 234 is configured to generate sensor data in two or more directions based on propagation of a bonding wave that bonds the semiconductor substrate 204 with another semiconductor substrate. The bonding operation may include a hybrid bonding operation, a eutectic bonding operation, a direct bonding operation, a fusion bonding operation, and/or another type of bonding operation. The sensor system 234 may be configured to monitor a bond region for deformation of the semiconductor substrate 204 and/or the propagation of the bonding wave during the bonding operation.

The sensor system 234 may include a laser micrometer, an optical micrometer, or another type of sensor that is configured to generate sensor data based on whether an optical signal 236 (e.g., an electromagnetic wave, a light wave) is permitted to propagate from one side of the semiconductor substrate 204 to an opposing side of the semiconductor substrate 204. The sensor system 234 may further include an optical transmitter and/or an optical receiver that transmit and/or receive the optical signal 236.

In some implementations, the controller 110 is configured to communicate with the sensor system 234, the vacuum supply system 210, the gas supply system 218, and/or the vacuum supply system 228 to control and/or tune parameters related to the bonding operation. In some implementations, controlling and tuning the parameters related to the bonding operation may be done in real-time and based on feedback received from the sensor system 234. Additionally, or alternatively, and in some implementations, controlling and/or tuning the parameters related to the bonding operation includes activating the gas supply system 218, adjusting a setting of the gas supply system 218 that controls a pressure within the inflatable forcing structure 214, activating the vacuum supply system 228, adjusting a setting of the gas supply system 218 that controls a rate of inflation of the inflatable forcing structure 214, or adjusting a setting of the vacuum supply system 228 that enables a specific pattern and/or subset of an array of vacuum port structures (e.g., a specific pattern and/or subset of an array of vacuum port structures including the vacuum port structure 226).

In some implementations, the controller 110 determines adjusted settings using a machine learning model. The machine learning model may include and/or may be associated with one or more of a neural network model, a random forest model, a clustering model, or a regression model, among other examples. In some implementations, the controller 110 uses the machine learning model to adjust a setting by providing candidate bonding wave parameters, materials included in the semiconductor substrate 204, and/or thicknesses of the semiconductor substrate 204 as inputs to the machine learning model, and using the machine learning model to determine a likelihood, probability, or confidence that a particular outcome (e.g., an overlay performance that satisfies a threshold) for a subsequent bonding operation will be achieved using the candidate parameters. In some implementations, the controller 110 provides an overlay performance as input to the machine learning model, and the controller 110 uses the machine learning model to determine or identify a particular combination of adjusted settings that are likely to achieve the overlay performance.

The controller 110 (or another system) may train, update, and/or refine the machine learning model to increase the accuracy of the outcomes and/or parameters determined using the machine learning model. The controller 110 may train, update, and/or refine the machine learning model based on feedback and/or results from the subsequent bonding operation, as well as from historical or related bonding operations (e.g., from hundreds, thousands, or more historical or related bonding operations) performed by the bonding tool 100.

FIG. 2B shows a bottom view of the bonding fixture 202. As shown in FIG. 2B, and in some implementations, the bonding fixture 202 (e.g., the chuck component 206) includes multiple (e.g., a quantity of eight) vacuum pad structures 208. Further, and as shown and in some implementations, the bonding fixture 202 (e.g., the inflatable forcing structure 214) includes multiple (e.g., a quantity of eight) vacuum port structures 226 that are arranged in a radial pattern 238.

Example dimensions shown in FIG. 2B include a width D1 (e.g., a diameter of the inflatable forcing structure 214), a width D2 (e.g., a diameter of the radial pattern 238) and a width D3 (e.g., a diameter of the vacuum port structure 226). In some implementations, and as an example, the width D1 is included in a range of approximately 75 millimeters to approximately 100 millimeters. Additionally, or alternatively, the width D2 is included in a range of approximately 30 millimeters to approximately 50 millimeters. Additionally, or alternatively, the width D3 is included in range of approximately 2 millimeters to approximately 3 millimeters.

The widths D1-D3 and the quantity of the vacuum port structures 226 may be interrelated. As such, combinations of the widths D1-D3 and/or the quantity of the vacuum port structures 226 may be selected based on factors that include a diameter of the inflatable forcing structure 214, an available vacuum pressure from a vacuum supply system (e.g., the vacuum supply system 228), an available pressure from a gas supply system (e.g., the gas supply system 218), a width, thickness, and/or material of a semiconductor substrate held by the bonding fixture 202 (e.g., the semiconductor substrate 204), a type of the chuck component 206 (e.g., an electrostatic chuck (ESC) type of chuck component, a vacuum type of chuck component), and/or a desired characteristic of a bonding wave, among other examples. However, other values and ranges for the widths D1-D3 and/or the quantity of the vacuum port structure(s) 226 are within the scope of the present disclosure.

As indicated above, FIGS. 2A and 2B are provided as examples. Other examples may differ from what is described with regard to FIGS. 2A and 2B.

In some implementations, and as described in connection with FIGS. 1, 2A and 2B, and elsewhere herein a bonding tool (e.g., the bonding tool 100) includes a processing chamber (e.g., the processing chamber 104). The bonding tool includes a bonding fixture (e.g., the bonding fixture 202), in the processing chamber, configured to hold a semiconductor substrate (e.g., the semiconductor substrate 204). The bonding fixture includes a chuck component (e.g., the chuck component 206), an inflatable forcing structure (e.g., the inflatable forcing structure 214) within a recess of the chuck component, and a vacuum port structure (e.g., the vacuum port structure 226) passing through the chuck component and through the inflatable forcing structure that is configured to provide a vacuum force (e.g., the vacuum force 232) that holds a bond region of the semiconductor substrate against the inflatable forcing structure. The bonding fixture includes a gas inlet port structure (e.g., the gas inlet port structure 216) passing through the chuck component and into the inflatable forcing structure that is configured to provide a pressurized gas (e.g., the pressurized gas 222) to inflate the inflatable forcing structure to form a convex curvature (e.g., the convex curvature 224) along an outer surface of the inflatable forcing structure that protrudes outside the recess, and to provide a force that deforms the bond region of the semiconductor substrate during a bonding operation that joins the semiconductor substrate with another semiconductor substrate.

In this way, the bonding tool may generate a more controlled bonding wave to improve an overlay performance. Improving the overlay performance may improve a yield of a product (e.g., a yield of a 3DIC device such as a CSI BSI device) to reduce an amount of resources (e.g., semiconductor processing tools, raw materials, manpower, and/or computing resources) needed to manufacture a volume of the product.

FIGS. 3A-3D are diagrams of an example implementation 300 of a bonding tool described herein. The bonding tool may correspond to the bonding tool 100 of FIG. 1 including one or more features described in connection with FIGS. 2A and 2B.

Figure 3A:
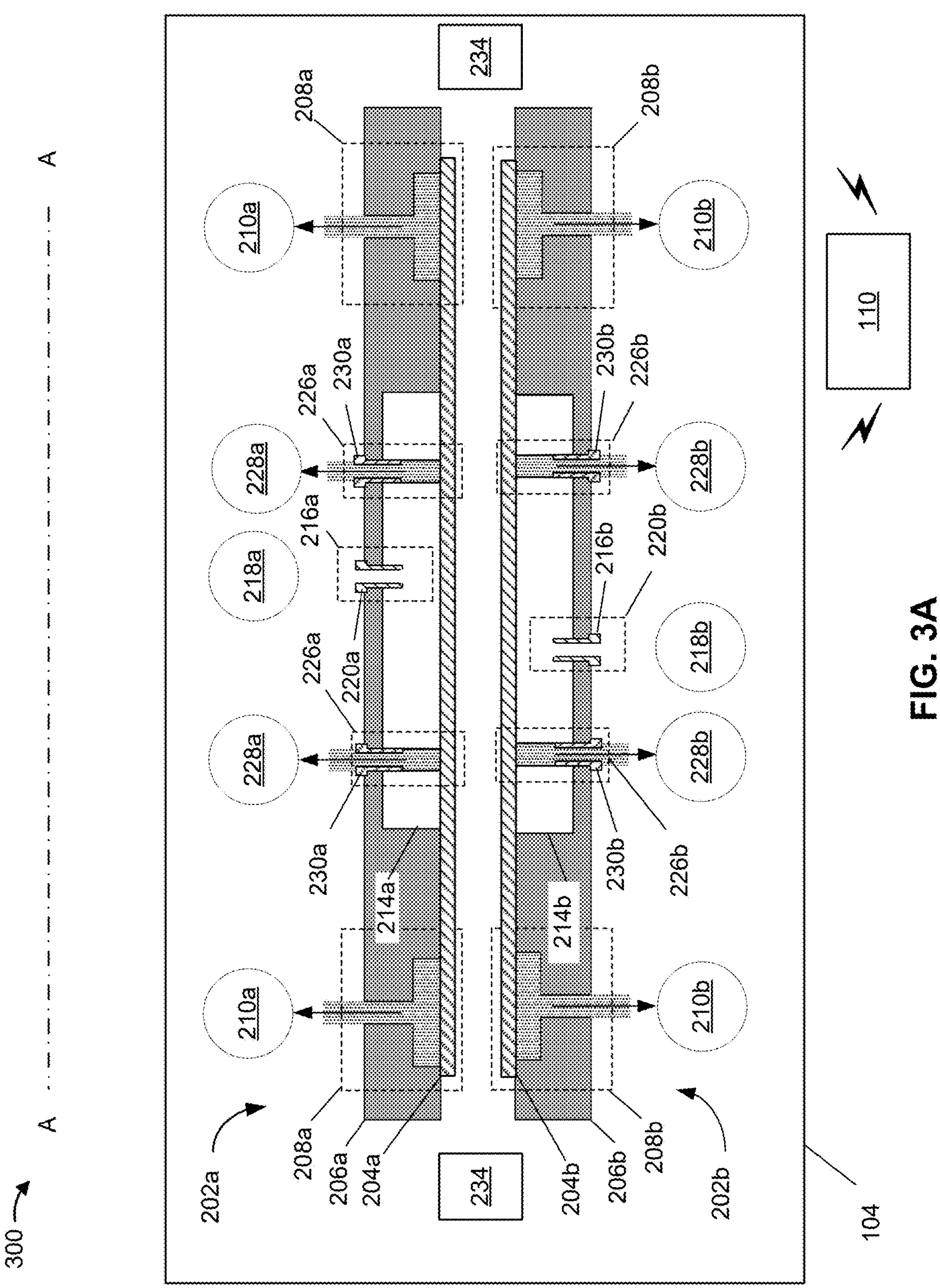
FIGS. 3A-3D are diagrams of an example implementation of a bonding tool described herein.

As shown in FIG. 3A, implementation 300 includes the processing chamber 104 (e.g., the processing chamber 104 of the bonding tool 100). The processing chamber 104 includes the bonding fixture **202*a* (e.g., an upper bonding fixture) and the bonding fixture 202*b* (a lower bonding fixture that is inverted relative to the upper bonding fixture). As part of a bonding operation in the processing chamber 104, the bonding fixture 202*a* receives the semiconductor substrate 204*a* and the bonding fixture 202*b* receives the semiconductor substrate 204*b***.

In FIG. 3A, the controller 110 activates one or more of the vacuum supply systems **210*a* and/or 210*b* to secure the semiconductor substrates 204*a* and/or 204*b* against respective chuck components (e.g., the chuck component 206*a* and/or the chuck component 206*b*). Additionally, or alternatively, the controller 110 activates or more of the vacuum supply systems 228***a* and/or 228*b* to secure the semiconductor substrates 204*a* and/or 204*b* against surfaces of respective inflatable forcing structures (e.g., the inflatable forcing structure 214*a* and/or the inflatable forcing structure 214*b*). In some implementations, the controller 110 adjusts a setting of one or more of the vacuum supply systems 210*a*, 210*b*, 228*a*, and/or 228*b* to control a vacuum pressure.

Figure 3B:
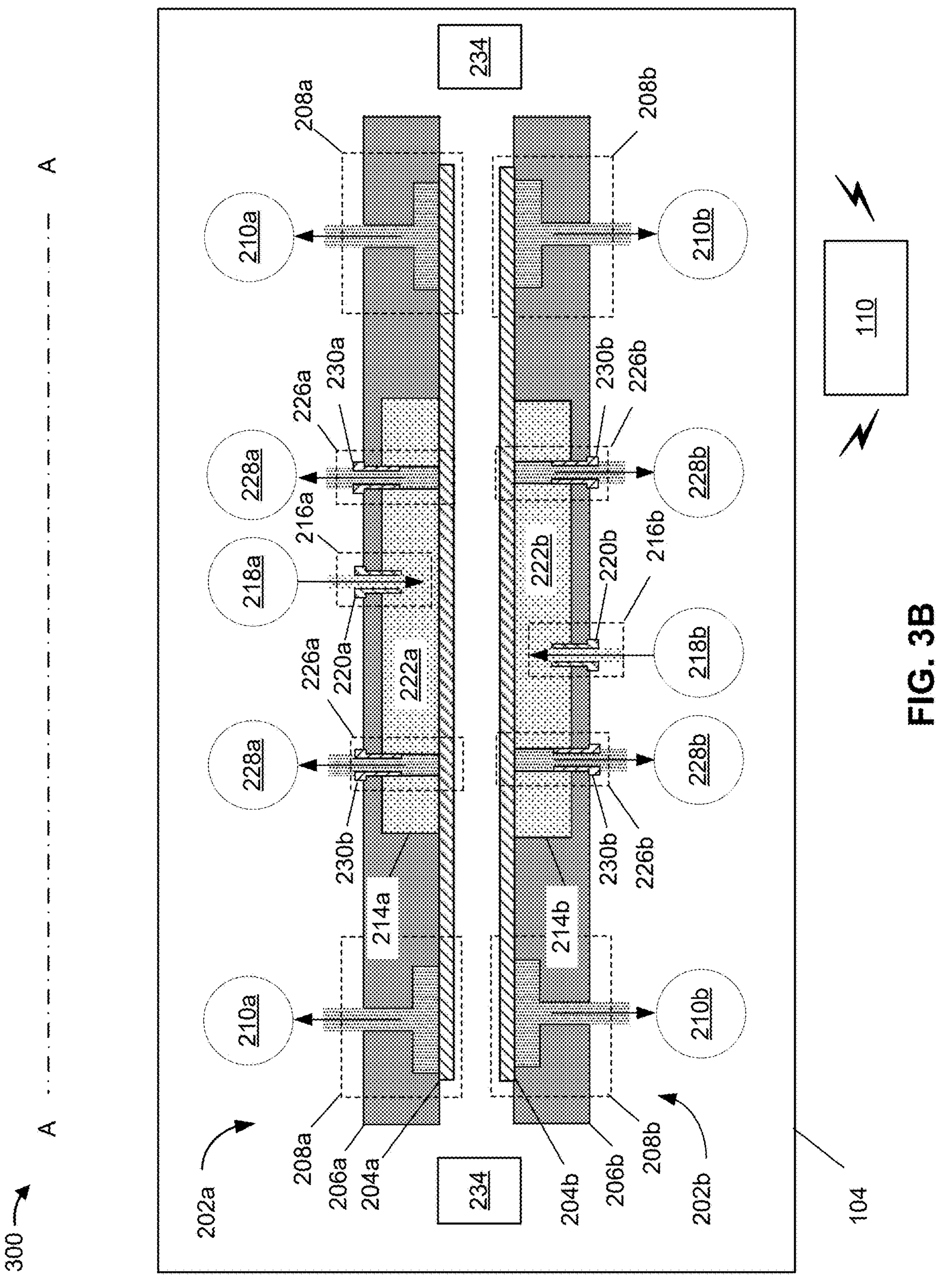

As shown in FIG. 3B, and as part of implementation 300, the controller 110 activates one or more of the gas supply systems 218*a* and/or 218*b* to provide pressurized gas (e.g., the pressurized gas 222*a* and/or 222*b*) to respective inflatable forcing structures (e.g., the inflatable forcing structure 214*a* and/or the inflatable forcing structure 214*b*). In some implementations, the controller 110 adjusts a setting of one or more of the gas supply systems 218*a* and/or 218*b* to control a pressure of the pressurized gas 222*a* and/or 222*b*. In some implementations, and as described in connection with FIG. 2A, adjusting the setting is based on an output of a machine learning model.

Figure 3C:
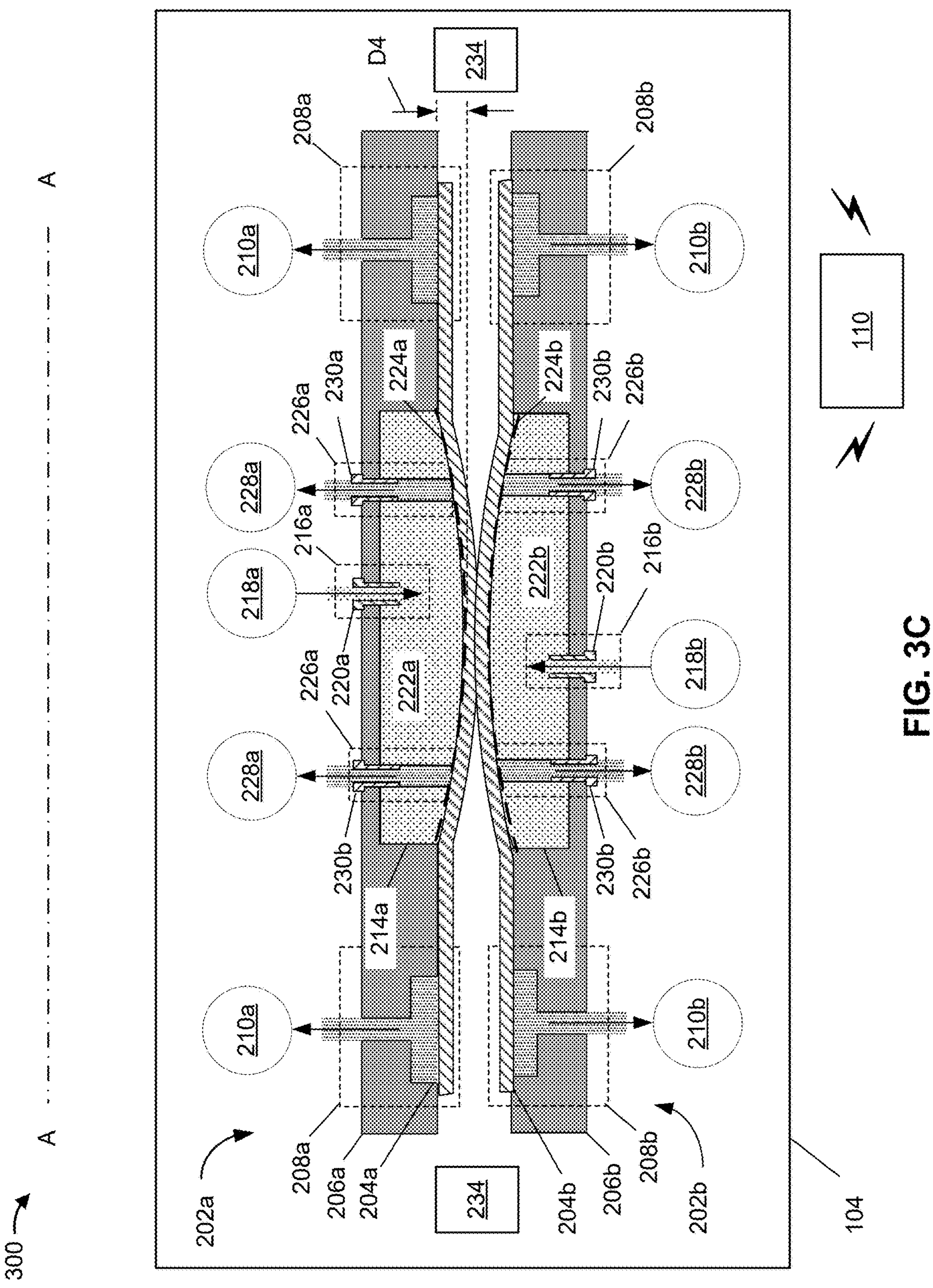

As shown in FIG. 3C, and as part of implementation 300, the inflatable forcing structure 214*a* deforms a bond region of the semiconductor substrate 204*a*. In some implementations, and after inflation, the inflatable forcing structure 214*a* forms the convex curvature 224*a* along an outer surface of the inflatable forcing structure 214*a* that protrudes beyond a surface of the chuck component 206*a* to provide a force that deforms the bond region of the semiconductor substrate 204*a*.

As an example, the convex curvature 224*a* may protrude beyond the surface of the chuck component a distance D4 that is included in a range from greater than 0 microns and up to approximately 100 microns. A distance that is less than or equal to approximately 100 microns may be sufficient to deform the bond region of the semiconductor substrate 204*a* and/or initiate propagation of a bonding wave without damaging the semiconductor substrate 204*a*. A distance that is greater than approximately 100 microns may cause excessive deformation of the bond region of the semiconductor substrate 204*a* that damages the semiconductor substrate 204*a*. However, other values and ranges for the distance D4 are included within the scope of the present disclosure.

As further shown in FIG. 3C, and as part of implementation 300, the inflatable forcing structure 214*b* deforms a bond region of the semiconductor substrate 204*b*. In some implementations, and after inflation, the inflatable forcing structure 214*b* forms the convex curvature 224*b* along an outer surface of the inflatable forcing structure 214*b* that protrudes beyond a surface of the chuck component 206*b* to provide a force that deforms the bond region of the semiconductor substrate 204*b*. Deformation of the semiconductor substrate 204*b*, in combination with deformation of the semiconductor substrate 204*a*, may initiate propagation of a bonding wave across the semiconductor substrates 204*a* and 204*b* to join the semiconductor substrates 204*a* and 204*b*.

Figure 3D:
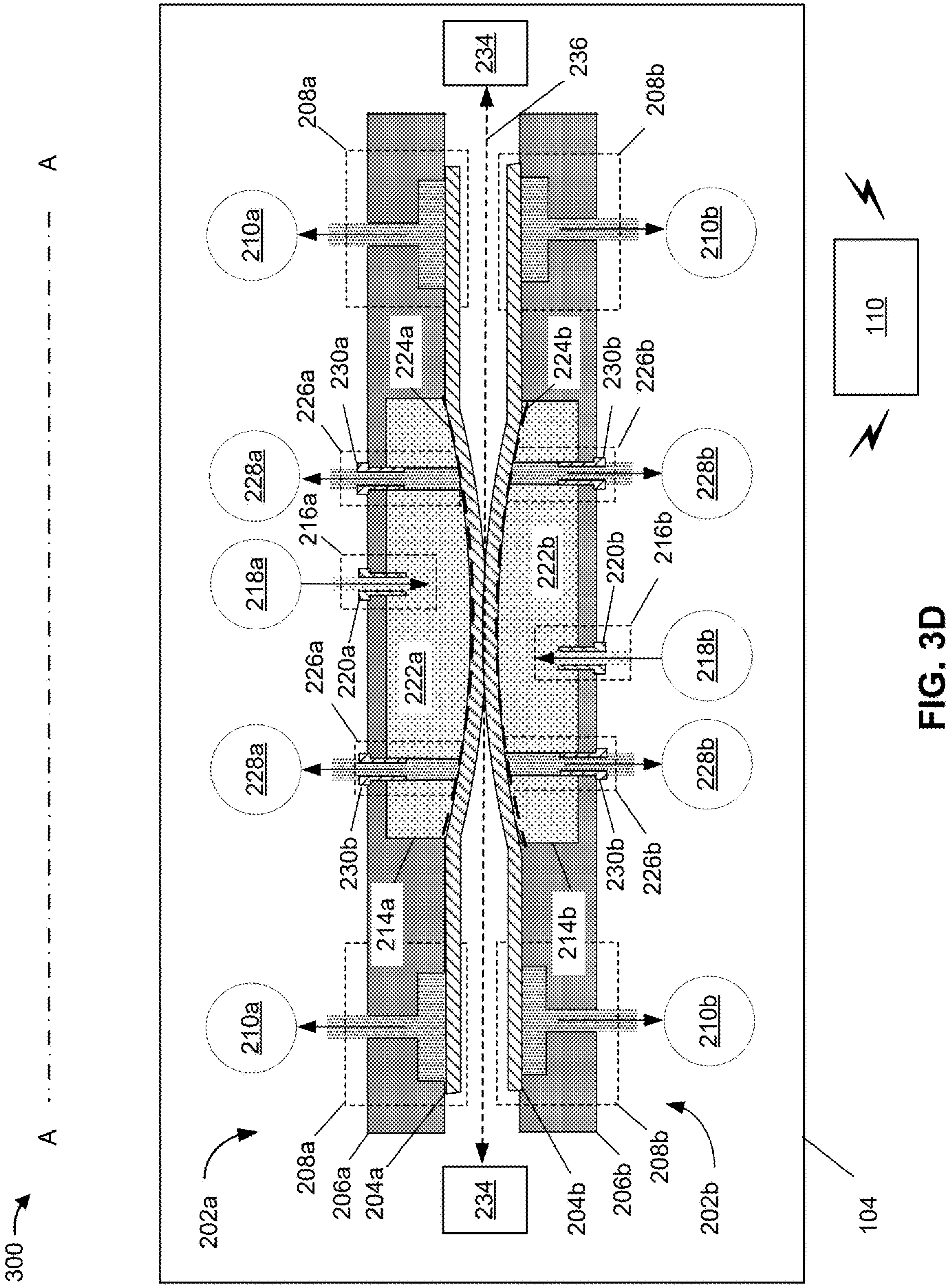

As shown in FIG. 3D, and as part of implementation 300, the controller 110 activates the sensor system 234. In some implementations, the sensor system 234 uses the optical signal 236 to monitor one or more parameters that may be related to deformation of central regions of the semiconductor substrate 204*a* and/or 204*b* (e.g., displacements). Additionally, or alternatively, the sensor system 234 may use the optical signal 236 to monitor one or more parameters that may be related to propagation of a bonding wave (e.g., an amplitude and/or a velocity of the bonding wave).

Based on information received from the sensor system 234, the controller 110 may, in real time, adjust a setting of one or more of the vacuum supply systems 210*a*, 210*b*, 228*a*, and/or 228*b* to control a vacuum pressure. Additionally, or alternatively, and based on information received from the sensor system 234, the controller 110 may, in real time, adjust a setting of one or more of the gas supply systems 218*a* and/or 218*b* to control a pressure of the pressurized gas 222*a* and/or 228*b*. In some implementations, the controller 110 uses the information received from the sensor system 234 in combination with a machine learning model to adjust such settings.

Additionally, or alternatively, and based on information received from the sensor system 234, the controller 110 may deactivate one of the vacuum supply systems 210*a*, 210*b*, 228*a*, and/or 228*b* to release the semiconductor substrates 204*a* and/or 204*b*. Additionally, or alternatively, and based on information received from the sensor system 234, the controller 110 may deactivate one of the gas supply systems 218*a* and/or 218*b*. In some implementations, the controller 110 uses the information received from the sensor system 234 in combination with a machine learning model to activate and/or deactivate such systems.

As indicated above, FIGS. 3A-3D are provided as an example. Other examples may differ from what is described with regard to FIGS. 3A-3D.

Figure 4:
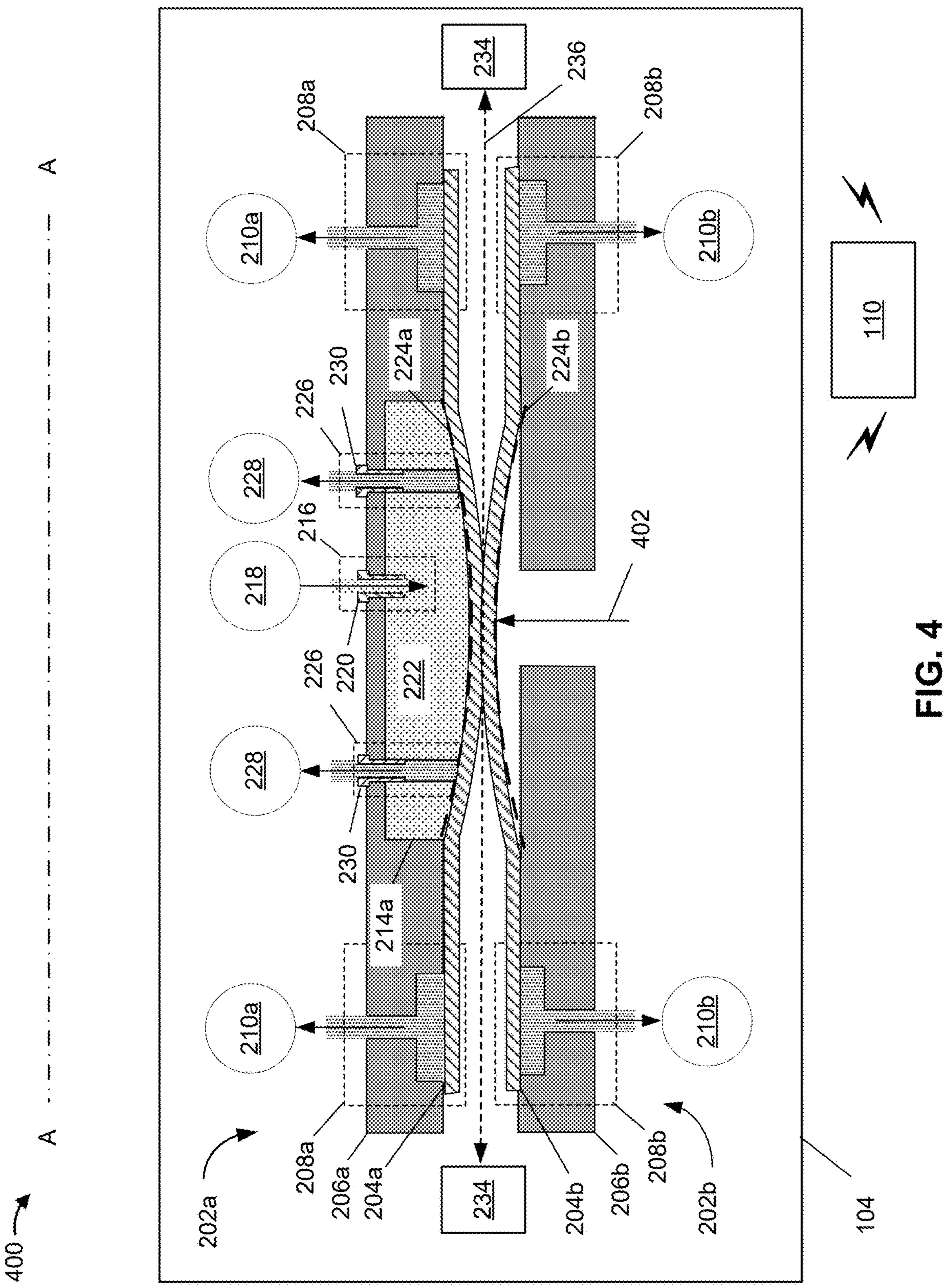
FIG. 4 is a diagram of an example implementation described herein.

FIG. 4 shows an example implementation 400 described herein. The implementation 400 includes the bonding fixture 202*a* and the bonding fixture 202*b* in the processing chamber 104. In contrast to FIG. 3A-3D, the processing chamber 104 of FIG. 4 includes a single bonding fixture having an inflatable forcing structure (e.g., the bonding fixture 202*a* having the inflatable forcing structure 214*a*) used in combination with another bonding fixture not including a forcing structure. For example, the bonding fixture 202*b* of FIG. 4 includes a forcing component 402 that may be a striker pin or another type of forcing component. Using techniques similar to those described in connection with FIGS. 3A-3D, the bonding fixture 202*a* and the bonding fixture 202*b* may be used to join the semiconductor substrates 204*a* and 204*b*.

As indicated above, FIG. 4 is provided as an example. Other examples may differ from what is described with regard to FIG. 4.

Figure 5:
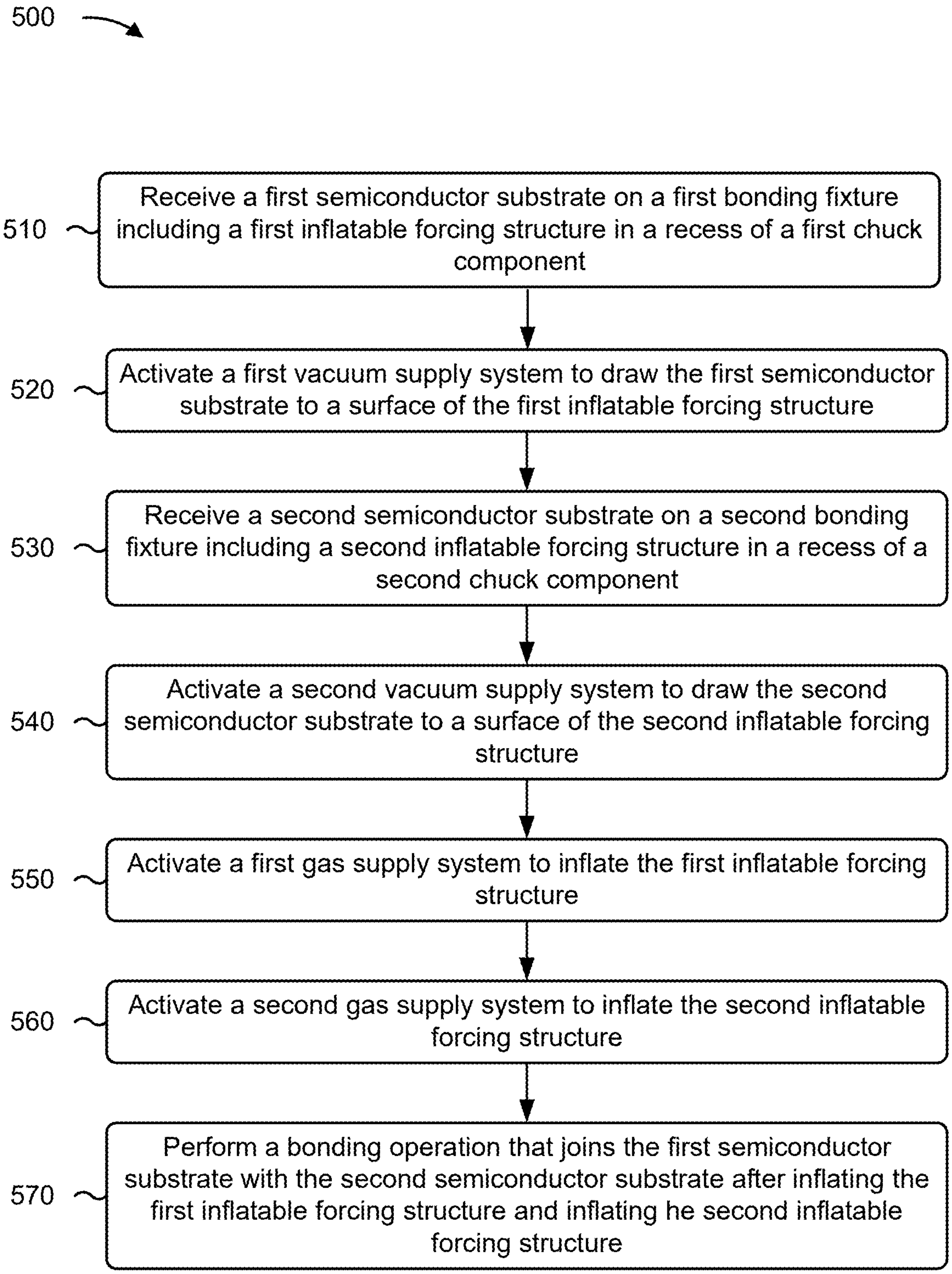
FIG. 5 is a flowchart of an example process associated with semiconductor substrate bonding.

FIG. 5 is a flowchart of an example process 500 associated with semiconductor substrate bonding. In some implementations, one or more process blocks of FIG. 5 are performed by a bonding tool (e.g., the bonding tool 100). In some implementations, one or more process blocks of FIG. 5 are performed by another device or a group of devices separate from or including the bonding tool, such as the controller 110, the bonding fixture 202 including the chuck component 206 and the inflatable forcing structure 214, the gas supply system 218, and/or the vacuum supply system 228.

As shown in FIG. 5, process 500 may include receiving a first semiconductor substrate on a first bonding fixture including a first inflatable forcing structure in a recess of a first chuck component (block 510). For example, a bonding tool (e.g., the bonding tool 100) may receive a first semiconductor substrate (e.g., the semiconductor substrate 204*a*) on a first bonding fixture (e.g., the bonding fixture 202*a*) including a first inflatable forcing structure (e.g., the inflatable forcing structure 214*a*) in a recess of a first chuck component (e.g., the chuck component 206*a*), as described above. In some implementations, the first bonding fixture includes a first vacuum port structure (e.g., the vacuum port structure 226*a*) passing through the first inflatable forcing structure and the first chuck component.

As further shown in FIG. 5, process 500 may include activating a first vacuum supply system to draw the first semiconductor substrate to a surface of the first inflatable forcing structure (block 520). For example, a controller (e.g., the controller 110) may activate a first vacuum supply system (e.g., the vacuum supply system 228*a*) to draw the first semiconductor substrate to a surface of the first inflatable forcing structure, as described above.

As further shown in FIG. 5, process 500 may include receiving a second semiconductor substrate on a second bonding fixture including a second inflatable forcing structure in a recess of a second chuck component (block 530). For example, the bonding tool may receive a second semiconductor substrate (e.g., the semiconductor substrate 204*b*) on a second bonding fixture (e.g., the bonding fixture 202*b*) including a second inflatable forcing structure (e.g., the inflatable forcing structure 214*b*) in a recess of a second chuck component (the chuck component 206*b*), as described above. In some implementations, the second bonding fixture includes a second vacuum port structure (e.g., the vacuum port structure 226*b*) passing through the second inflatable forcing structure and the second chuck component.

As further shown in FIG. 5, process 500 may include activating a second vacuum supply system to draw the second semiconductor substrate to a surface of the second inflatable forcing structure (block 540). For example, the controller may activate a second vacuum supply system (e.g., the vacuum supply system 228*b*) to draw the second semiconductor substrate to a surface of the second inflatable forcing structure, as described above.

As further shown in FIG. 5, process 500 may include activating a first gas supply system to inflate the first inflatable forcing structure (block 550). For example, the controller may activate a first gas supply system (e.g., the gas supply system 218*a*) to inflate the first inflatable forcing structure, as described above.

As further shown in FIG. 5, process 500 may include activating a second gas supply system to inflate the second inflatable forcing structure (block 560). For example, the controller may activate a second gas supply system (e.g., the gas supply system 218*b*) to inflate the second inflatable forcing structure, as described above.

As further shown in FIG. 5, process 500 may include performing a bonding operation that joins the first semiconductor substrate with the second semiconductor substrate after inflating the first inflatable forcing structure and inflating the second inflatable forcing structure (block 570). For example, the bonding tool may perform a bonding operation that joins the first semiconductor substrate with the second semiconductor substrate after inflating the first inflatable forcing structure and inflating the second inflatable forcing structure, as described above.

Process 500 may include additional implementations, such as any single implementation or any combination of implementations described below and/or in connection with one or more other processes described elsewhere herein.

In a first implementation, process 500 includes monitoring a bond region between the first semiconductor substrate and the second semiconductor substrate during the bonding operation to determine one or more parameters related to a propagation of a bonding wave, and adjusting a first setting of the first gas supply system to control a pressure within the first inflatable forcing structure based on the one or more parameters.

In a second implementation, alone or in combination with the first implementation, process 500 includes monitoring a bond region between the first semiconductor substrate and the second semiconductor substrate during the bonding operation to determine one or more parameters related to a propagation of a bonding wave, and adjusting a first setting of the first gas supply system to control a rate of inflation within the first inflatable forcing structure based on the one or more parameters.

In a third implementation, alone or in combination with one or more of the first and second implementations, process 500 includes monitoring a bond region between the first semiconductor substrate and the second semiconductor substrate during the bonding operation to determine one or more parameters related to a propagation of a bonding wave, and deactivating the first vacuum supply system to release the first semiconductor substrate from the surface of the first inflatable forcing structure during the bonding operation.

Although FIG. 5 shows example blocks of process 500, in some implementations, process 500 includes additional blocks, fewer blocks, different blocks, or differently arranged blocks than those depicted in FIG. 5. Additionally, or alternatively, two or more of the blocks of process 500 may be performed in parallel.

Figure 6:
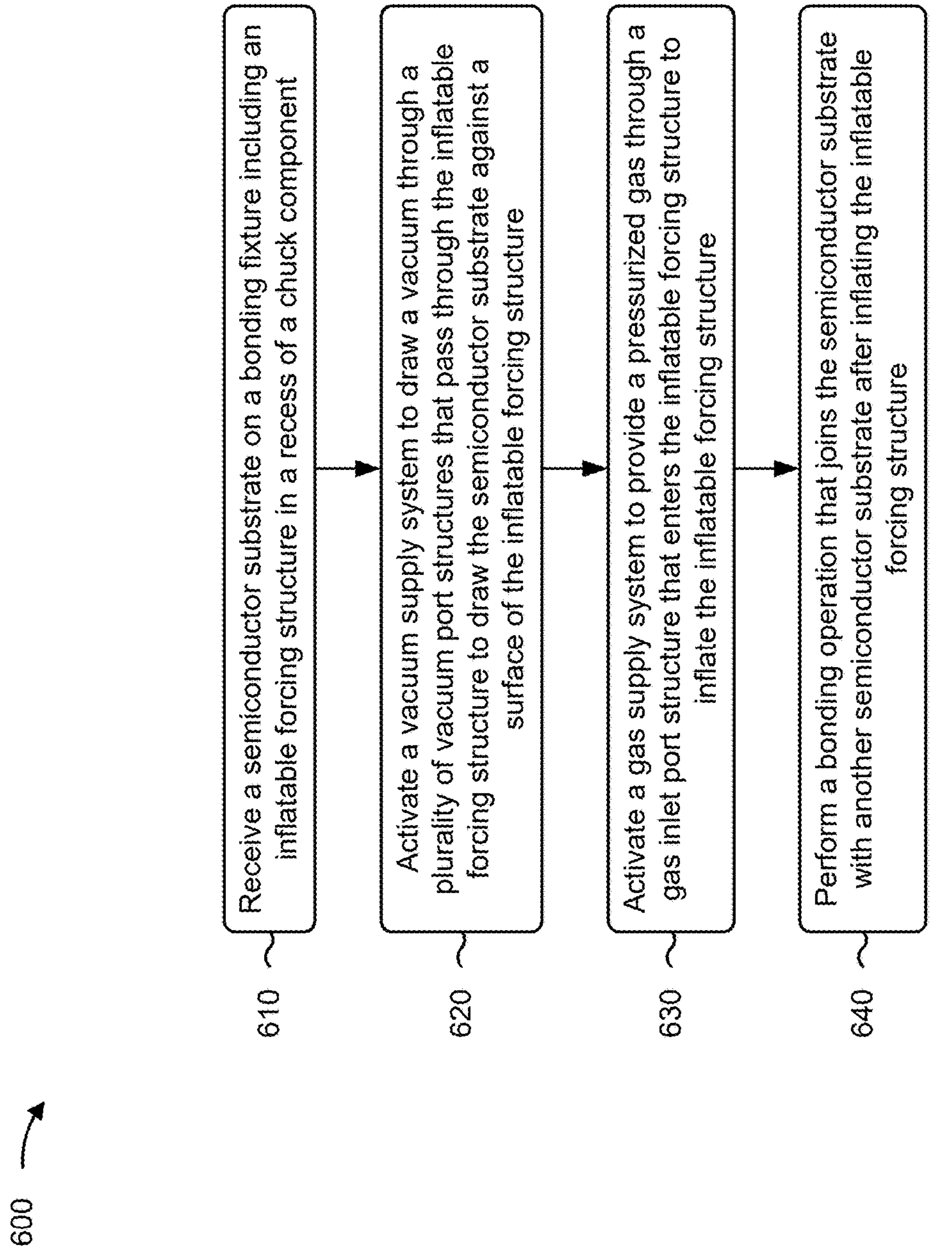
FIG. 6 is a flowchart of an example process associated with semiconductor substrate bonding.

FIG. 6 is a flowchart of an example process 600 associated with semiconductor substrate bonding. In some implementations, one or more process blocks of FIG. 6 are performed by a bonding tool (e.g., the bonding tool 100). In some implementations, one or more process blocks of FIG. 6 are performed by another device or a group of devices separate from or including the bonding tool, such as the controller 110, the bonding fixture 202 including the chuck component 206 and the inflatable forcing structure 214, the gas supply system 218, and/or the vacuum supply system 228. Additionally, or alternatively, one or more process blocks of FIG. 6 may be performed by one o As shown in FIG. 6, process 600 may include receiving a semiconductor substrate on a bonding fixture including an inflatable forcing structure in a recess of a chuck component (block 610). For example, the bonding tool (e.g., the bonding tool 100) may receive a semiconductor substrate (e.g., the semiconductor substrate 204) on a bonding fixture (e.g., the bonding fixture 202) including an inflatable forcing structure (e.g., the inflatable forcing structure 214) in a recess of a chuck component (e.g., the chuck component 206), as described above.

As further shown in FIG. 6, process 600 may include activating a vacuum supply system to draw a vacuum through a plurality of vacuum port structures that pass through the inflatable forcing structure to draw the semiconductor substrate against a surface of the inflatable forcing structure (block 620). For example, a controller (e.g., the controller 110) may activate a vacuum supply system (e.g., the vacuum supply system 228) to draw a vacuum through a plurality of vacuum port structures (e.g., a plurality of vacuum port structure(s) 226) that pass through the inflatable forcing structure to draw the semiconductor substrate against a surface of the inflatable forcing structure, as described above.

As further shown in FIG. 6, process 600 may include activating a gas supply system to provide a pressurized gas through a gas inlet port structure that enters the inflatable forcing structure to inflate the inflatable forcing structure (block 630). For example, the controller may activate a gas supply system (e.g., the gas supply system 218) to provide a pressurized gas (e.g., the pressurized gas 222) through a gas inlet port structure (e.g., the gas inlet port structure 216) that enters the inflatable forcing structure to inflate the inflatable forcing structure, as described above.

As further shown in FIG. 6, process 600 may include performing a bonding operation that joins the semiconductor substrate with another semiconductor substrate after inflating the inflatable forcing structure (block 640). For example, the bonding tool may perform a bonding operation that joins the semiconductor substrate with another semiconductor substrate after inflating the inflatable forcing structure, as described above.

Process 600 may include additional implementations, such as any single implementation or any combination of implementations described below and/or in connection with one or more other processes described elsewhere herein.

In a first implementation, activating the gas supply system to provide the pressurized gas to inflate the inflatable forcing structure forms a convex curvature (e.g., the convex curvature 224) along an outer surface of the inflatable forcing structure that protrudes beyond a surface of the chuck component to provide a force that deforms a bond region of the semiconductor substrate during the bonding operation.

In a second implementation, alone or in combination with the first implementation, a distance (e.g., the distance D4) that the convex curvature protrudes beyond the surface of the chuck component is included in a range from greater than 0 microns and up to approximately 100 microns.

In a third implementation, alone or in combination with one or more of the first and second implementations, activating the gas supply system to provide the pressurized gas to inflate the inflatable forcing structure includes activating the gas supply system to provide a pressurized nitrogen gas.

In a fourth implementation, alone or in combination with one or more of the first through third implementations, process 600 includes adjusting a setting that controls a pressure of the pressurized gas, where the pressure of the pressurized gas is included a range of approximately 50 millibars to approximately 1000 millibars.

In a fifth implementation, alone or in combination with one or more of the first through fourth implementations, adjusting the setting that controls the pressure of the pressurized gas is based on an output of a machine learning model.

In a sixth implementation, alone or in combination with one or more of the first through fifth implementations, process 600 includes monitoring a deformation of the semiconductor substrate during the bonding operation using a sensor system (e.g., the sensor system 234), and adjusting a setting that controls a pressure of the pressurized gas based on information received from the sensor system.

In a seventh implementation, alone or in combination with one or more of the first through sixth implementations, process 600 includes monitoring a deformation of the semiconductor substrate during the bonding operation using a sensor system, and adjusting a setting of the vacuum supply system that controls a vacuum force on the semiconductor substrate based on information received from the sensor system.

Although FIG. 6 shows example blocks of process 600, in some implementations, process 600 includes additional blocks, fewer blocks, different blocks, or differently arranged blocks than those depicted in FIG. 6. Additionally, or alternatively, two or more of the blocks of process 600 may be performed in parallel.

Some implementations described herein provide a bonding tool having a top bonding fixture that includes an inflatable forcing structure (e.g., a gas bag). When pressurized, the inflatable forcing structure has a curved surface that protrudes from an under side of the top bonding fixture to deform a top semiconductor substrate during a bonding operation. A rate of inflation and/or a pressure within the inflatable forcing structure may be controlled to distribute a force more evenly in a bond region of the semiconductor substrate relative to another bonding tool having another top bonding fixture including a striker pin.

In this way, the bonding tool may generate a more controlled bonding wave to improve an overlay performance. Improving the overlay performance may improve a yield of a product (e.g., a yield of a 3DIC device such as a CSI BSI device) to reduce an amount of resources (e.g., semiconductor processing tools, raw materials, manpower, and/or computing resources) needed to manufacture a volume of the product.

As described in greater detail above, some implementations described herein provide a method. The method includes receiving a first semiconductor substrate on a first bonding fixture including a first inflatable forcing structure in a recess of a first chuck component, where the first bonding fixture includes a first vacuum port structure passing through the first inflatable forcing structure and the first chuck component. The method includes activating a first vacuum supply system to draw the first semiconductor substrate to a surface of the first inflatable forcing structure. The method includes receiving a second semiconductor substrate on a second bonding fixture including a second inflatable forcing structure in a recess of a second chuck component, where the second bonding fixture includes a second vacuum port structure passing through the second inflatable forcing structure and the second chuck component. The method includes activating a second vacuum supply system to draw the second semiconductor substrate to a surface of the second inflatable forcing structure. The method includes activating a first gas supply system to inflate the first inflatable forcing structure. The method includes activating a second gas supply system to inflate the second inflatable forcing structure. The method includes performing a bonding operation that joins the first semiconductor substrate with the second semiconductor substrate after inflating the first inflatable forcing structure and inflating the second inflatable forcing structure.

As described in greater detail above, some implementations described herein provide a method. The method includes receiving a semiconductor substrate on a bonding fixture including an inflatable forcing structure in a recess of a chuck component. The method includes activating a vacuum supply system to draw a vacuum through a plurality of vacuum port structures that pass through the inflatable forcing structure to draw the semiconductor substrate against a surface of the inflatable forcing structure. The method includes activating a gas supply system to provide a pressurized gas through a gas inlet port structure that enters the inflatable forcing structure to inflate the inflatable forcing structure. The method includes performing a bonding operation that joins the semiconductor substrate with another semiconductor substrate after inflating the inflatable forcing structure.

As described in greater detail above, some implementations described herein provide a bonding tool. The bonding tool includes a processing chamber. The bonding tool includes a bonding fixture, in the processing chamber, configured to hold a semiconductor substrate. The bonding fixture includes a chuck component, an inflatable forcing structure within a recess of the chuck component, and a vacuum port structure passing through the chuck component and through the inflatable forcing structure that is configured to provide a vacuum force that holds a bond region of the semiconductor substrate against the inflatable forcing structure. The bonding fixture includes a gas inlet port structure passing through the chuck component and into the inflatable forcing structure that is configured to provide a pressurized gas to inflate the inflatable forcing structure to form a convex curvature along an outer surface of the inflatable forcing structure that protrudes outside the recess, and to provide a force that deforms the bond region of the semiconductor substrate during a bonding operation that joins the semiconductor substrate with another semiconductor substrate.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

As used herein, the term "and/or," when used in connection with a plurality of items, is intended to cover each of the plurality of items alone and any and all combinations of the plurality of items. For example, "A and/or B" covers "A and B," "A and not B," and "B and not A."

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

receiving a first semiconductor substrate on a first bonding fixture including a first inflatable forcing structure in a recess of a first chuck component, wherein the first bonding fixture includes a first vacuum port structure passing through the first inflatable forcing structure and the first chuck component;

activating a first vacuum supply system to draw the first semiconductor substrate to a surface of the first inflatable forcing structure;

receiving a second semiconductor substrate on a second bonding fixture including a second inflatable forcing structure in a recess of a second chuck component, wherein the second bonding fixture includes a second vacuum port structure passing through the second inflatable forcing structure and the second chuck component;

activating a second vacuum supply system to draw the second semiconductor substrate to a surface of the second inflatable forcing structure;

activating a first gas supply system to inflate the first inflatable forcing structure;

activating a second gas supply system to inflate the second inflatable forcing structure; and performing a bonding operation that joins the first semiconductor substrate with the second semiconductor substrate after inflating the first inflatable forcing structure and inflating the second inflatable forcing structure.

2. The method of claim 1, further including:

monitoring a bond region between the first semiconductor substrate and the second semiconductor substrate during the bonding operation to determine one or more parameters related to a propagation of a bonding wave, and adjusting a first setting of the first gas supply system to control a pressure within the first inflatable forcing structure based on the one or more parameters.

3. The method of claim 1, further including:

monitoring a bond region between the first semiconductor substrate and the second semiconductor substrate during the bonding operation to determine one or more parameters related to a propagation of a bonding wave, and adjusting a first setting of the first gas supply system to control a rate of inflation within the first inflatable forcing structure based on the one or more parameters.

4. The method of claim 1, further including:

monitoring a bond region between the first semiconductor substrate and the second semiconductor substrate during the bonding operation to determine one or more parameters related to a propagation of a bonding wave, and deactivating the first vacuum supply system to release the first semiconductor substrate from the surface of the first inflatable forcing structure during the bonding operation.

5. A method, comprising:

receiving a semiconductor substrate on a bonding fixture including an inflatable forcing structure in a recess of a chuck component;

activating a vacuum supply system to draw a vacuum through a plurality of vacuum port structures that pass through the inflatable forcing structure to draw the semiconductor substrate against a surface of the inflatable forcing structure;

activating a gas supply system to provide a pressurized gas through a gas inlet port structure that enters the inflatable forcing structure to inflate the inflatable forcing structure; and performing a bonding operation that joins the semiconductor substrate with another semiconductor substrate after inflating the inflatable forcing structure.

6. The method of claim 5, wherein activating the gas supply system to provide the pressurized gas to inflate the inflatable forcing structure forms a convex curvature along an outer surface of the inflatable forcing structure that protrudes beyond a surface of the chuck component to provide a force that deforms a bond region of the semiconductor substrate during the bonding operation.

7. The method of claim 6, wherein a distance that the convex curvature protrudes beyond the surface of the chuck component is included in a range from greater than 0 microns and up to approximately 100 microns.

8. The method of claim 5, wherein activating the gas supply system to provide the pressurized gas to inflate the inflatable forcing structure includes:

activating the gas supply system to provide a pressurized nitrogen gas.

9. The method of claim 5, further including:

adjusting a setting that controls a pressure of the pressurized gas, wherein the pressure of the pressurized gas is included a range of approximately 50 millibars to approximately 1000 millibars.

10. The method of claim 9, wherein adjusting the setting that controls the pressure of the pressurized gas is based on an output of a machine learning model.

11. The method of claim 5, further including:

monitoring a deformation of the semiconductor substrate during the bonding operation using a sensor system; and adjusting a setting that controls a pressure of the pressurized gas based on information received from the sensor system.

12. The method of claim 5, further comprising:

monitoring a deformation of the semiconductor substrate during the bonding operation using a sensor system; and adjusting a setting of the vacuum supply system that controls a vacuum force on the semiconductor substrate based on information received from the sensor system.

13. A bonding tool, comprising:

a processing chamber; and a bonding fixture, in the processing chamber, configured to hold a semiconductor substrate and comprising:

a chuck component;

an inflatable forcing structure within a recess of the chuck component;

a vacuum port structure passing through the chuck component and through the inflatable forcing structure, and configured to provide a vacuum force that holds a bond region of the semiconductor substrate against the inflatable forcing structure; and a gas inlet port structure passing through the chuck component and into the inflatable forcing structure, and configured to provide a pressurized gas to inflate the inflatable forcing structure to form a convex curvature along an outer surface of the inflatable forcing structure that protrudes outside the recess, and to provide a force that deforms the bond region of the semiconductor substrate during a bonding operation that joins the semiconductor substrate with another semiconductor substrate.

14. The bonding tool of claim 13, wherein the vacuum port structure comprises:

a sleeve component that passes through the chuck component and into the inflatable forcing structure.

15. The bonding tool of claim 13, wherein the inflatable forcing structure corresponds to an enclosed gas bag that includes a titanium nitride material.

16. The bonding tool of claim 13, wherein the inflatable forcing structure corresponds to an enclosed gas bag that includes a 3 mol percentage yttria-stabilized zirconia material.

17. The bonding tool of claim 13, wherein the vacuum port structure is one of a plurality of vacuum port structures that pass through the chuck component and through the inflatable forcing structure.

18. The bonding tool of claim 17, wherein the plurality of vacuum port structures are arranged in a radial pattern.

19. The bonding tool of claim 13, further comprising:

a vacuum supply system connected to the vacuum port structure and configured to draw a vacuum that provides the vacuum force through the vacuum port structure;

a gas supply system connected to the gas inlet port structure and configured to provide the pressurized gas through the gas inlet port structure; and a controller configured to:

adjust a first setting to control a pressure of the vacuum, and adjust a second setting to control a pressure of the pressurized gas.

20. The bonding tool of claim 19, further comprising:

a sensor system configured to monitor a bonding wave propagation during the bonding operation, and wherein the controller is further configured to:

adjust the first setting or the second setting based on the bonding wave propagation.

* * * * *